United States Patent
Groeppel et al.

(10) Patent No.: US 8,866,479 B2
(45) Date of Patent: *Oct. 21, 2014

(54) CASTING COMPOUND SUITABLE FOR CASTING AN ELECTRONIC MODULE, IN PARTICULAR A LARGE-VOLUME COIL SUCH AS A GRADIENT COIL

(75) Inventors: Peter Groeppel, Erlangen (DE);
Juergen Huber, Erlangen (DE);
Gerhard Piecha, Nuremberg (DE);
Lothar Schoen, Neunkirchen (DE);
Matthias Uebler, Ursensollen (DE)

(73) Assignee: Siemens Aktiengesellschaft, Munich (DE)

( * ) Notice: Subject to any disclaimer, the term of this patent is extended or adjusted under 35 U.S.C. 154(b) by 700 days.

This patent is subject to a terminal disclaimer.

(21) Appl. No.: 12/940,369

(22) Filed: Nov. 5, 2010

(65) Prior Publication Data
US 2011/0115488 A1    May 19, 2011

(30) Foreign Application Priority Data
Nov. 19, 2009    (DE) .......................... 10 2009 053 965

(51) Int. Cl.
*G01R 33/385*    (2006.01)
*H01F 6/06*    (2006.01)
*B82Y 30/00*    (2011.01)
*C08K 3/22*    (2006.01)
*C09D 147/00*    (2006.01)
*H01F 5/06*    (2006.01)
*C08J 5/00*    (2006.01)
*H01F 27/32*    (2006.01)

(52) U.S. Cl.
CPC ............. *G01R 33/3858* (2013.01); *B82Y 30/00* (2013.01); *C08J 5/005* (2013.01); *H01F 27/327* (2013.01); *H01F 6/06* (2013.01); *C08K 3/22* (2013.01); *C08K 2201/011* (2013.01); *Y10S 977/773* (2013.01); *Y10S 977/788* (2013.01); *Y10S 977/95* (2013.01)
USPC ........... 324/318; 977/773; 977/788; 977/950; 523/139; 523/205; 324/322

(58) Field of Classification Search
USPC .......................... 324/300–322; 382/128–131; 600/407–435; 623/1.15, 1.46; 523/443, 523/139, 205, 200; 524/492; 977/773, 788, 977/950; 106/287.35; 252/500; 428/328, 428/325; 310/208, 52
See application file for complete search history.

(56) References Cited

U.S. PATENT DOCUMENTS

| | | | | |
|---|---|---|---|---|
| 5,235,283 | A * | 8/1993 | Lehne et al. .................. | 324/318 |
| 6,441,614 | B1 * | 8/2002 | Edelstein et al. ............. | 324/318 |
| 6,519,822 | B1 | 2/2003 | Stelzl et al. | |
| 6,642,717 | B2 * | 11/2003 | Dietz et al. ................... | 324/318 |
| 7,154,270 | B2 * | 12/2006 | Arz et al. ...................... | 324/318 |
| 7,190,170 | B1 * | 3/2007 | Seeber et al. ................. | 324/411 |
| 7,297,375 | B2 * | 11/2007 | Wegner et al. ................ | 427/553 |

(Continued)

FOREIGN PATENT DOCUMENTS

WO    WO 2008/022614 A2    2/2008

*Primary Examiner* — Melissa Koval
*Assistant Examiner* — Tiffany Fetzner
(74) *Attorney, Agent, or Firm* — Schiff Hardin LLP

(57) ABSTRACT

Casting compound suitable for casting an electronic module, in particular a large-volume coil such as a gradient coil, which is composed of a support material forming a matrix, one or more fillers made of inorganic microparticles, and at least one filler made of polymer nanoparticles.

19 Claims, 1 Drawing Sheet

(56) References Cited

U.S. PATENT DOCUMENTS

| | | | |
|---|---|---|---|
| 7,560,145 B2* | 7/2009 | Ouchi et al. | 428/1.1 |
| 7,955,661 B2* | 6/2011 | Stevens et al. | 427/407.1 |
| 8,030,818 B2* | 10/2011 | Nelson et al. | 310/208 |
| 8,305,174 B2* | 11/2012 | Groeppel et al. | 335/216 |
| 8,343,270 B2* | 1/2013 | Jennrich et al. | 106/287.35 |
| 8,487,019 B2* | 7/2013 | Nelson et al. | 523/200 |
| 2002/0008516 A1* | 1/2002 | Dietz et al. | 324/318 |
| 2005/0096423 A1 | 5/2005 | Jennrich et al. | |
| 2005/0168222 A1* | 8/2005 | Arz et al. | 324/318 |
| 2005/0216075 A1* | 9/2005 | Wang et al. | 623/1.15 |
| 2005/0277349 A1* | 12/2005 | Smith et al. | 442/59 |
| 2007/0026221 A1* | 2/2007 | Stevens et al. | 428/325 |
| 2007/0114704 A1* | 5/2007 | Stevens et al. | 264/643 |
| 2007/0191513 A1* | 8/2007 | Jenrich et al. | 523/443 |
| 2008/0284262 A1* | 11/2008 | Nelson et al. | 310/52 |
| 2009/0242844 A1* | 10/2009 | Elkovitch | 252/500 |
| 2010/0022857 A1* | 1/2010 | Ergeneman et al. | 600/310 |
| 2010/0265019 A1* | 10/2010 | Groeppel et al. | 335/216 |
| 2010/0291374 A1* | 11/2010 | Akarsu et al. | 428/328 |
| 2011/0115488 A1* | 5/2011 | Groeppel et al. | 324/318 |
| 2013/0169277 A1* | 7/2013 | Huber et al. | 324/322 |

* cited by examiner

CASTING COMPOUND SUITABLE FOR CASTING AN ELECTRONIC MODULE, IN PARTICULAR A LARGE-VOLUME COIL SUCH AS A GRADIENT COIL

BACKGROUND OF THE INVENTION

1. Field of the Invention

The invention concerns a casting compound suitable for casting an electronic module, in particular a large-volume coil such as a gradient coil.

2. Description of the Prior Art

Gradient coils of a magnetic resonance apparatus are formed of three sub-coils with which magnetic field gradients are generated in the three spatial directions. The X-coils and Y-coils are typically fashioned as saddle coils; the Z-coil is realized by means of a peripheral winding. The individual coils can be constructed both from bundled individual conductors and by separating structures in an electrically conductive plate (advantageously made of copper or aluminum) generated with suitable processing methods with, the remaining material representing the coil winding. The coil windings produced according to the different methods are then glued to an electrically insulating support plate and formed into the shape of a half-cylindrical shell, for example. The individual coil layers are mounted successively on a cylindrical mandrel. Additional components of the coil structure are insulation and reinforcement layers; one or more cooling layers composed of plastic tubes to conduct a cooling fluid (typically water); and possibly items known as shim coils. Additional layers in the coil structure are, for example, secondary windings that serve to externally shield the magnetic field generated by the primary coils.

The complete coil structure is cast with a casting compound (a casting resin based on epoxy resin), with which it is intended that all conductor interstices are impregnated without cavities and bubbles. A multitude of requirements are imposed on the casting compound (thus the casting resin). It must have a sufficiently low processing viscosity in order to be able to fill or penetrate all conductor interstices so as to be free of voids and bubbles. It should exhibit a high modulus of elasticity in order to be able to ensure a high overall rigidity and a positionally accurate fixing of the individual windings of the coil. It should also have good thermal conductivity in order to enable effective heat transport from the conductor structures (which generate heat during operation) to the cooling layer. The glass transition temperature (and therefore also the heat forming resistance) should be as high as possible in order to have an optimally constant property profile in the usage temperature range. The coefficient of thermal expansion should be as low as possible, preferably close to that of the other materials (copper conductors, insulation layers, etc.) that are used in order to minimize mechanical stresses (and thus the formation of cracks and delaminations in the coil composite that are due to these stresses) given heating due to operation or cooling from the curing temperature at which the casting resin is cured. In particular, the cracking resistance should be very high. The cracking resistance is characterized by a high critical stress intensity factor $K_{1C}$ associated with a high critical fracture energy $G_{1C}$. The partial discharge resistance should also be high in order to avoid a damage to the mold material during the service life. The dielectric loss factor should be low.

Heat-curing casting resins based on epoxy resin are typically used as casting compounds, specifically for large-volume coils. Such a casting compound typically contains approximately 65% filler, for example quartz powder, aluminum oxide or wollastonite with particle sizes in the micrometer range, meaning that the filler consists of microparticles.

A casting compound and a magnetic coil cast with such a casting compound are known from EP 1 850 145 A2. This casting compound is mixed (compounded) with microparticle fillers and inorganic nanoparticles. A good crack resistance based on a combination of a high critical stress intensity factor $K_{1C}$ with a high critical fracture energy $G_{1C}$ can be achieved with these inorganic fillers or filler combinations. The filler addition produces positive alterations of the aforementioned properties of the casting compound mold to be cured and the heat curing resistance, the fracture toughness, etc. An optimally high volume fraction of filler would be appropriate for these reasons. Particularly the flow behavior of the prepared casting compound, however, is drastically impaired by the filler content. The higher the filler content, the poorer the flow behavior, and therefore the property of being able to impregnate the given conductor interstices, etc. without voids and bubbles. A compromise with regard to the casting resin composition is thus always sought. Overall there is a need for a casting resin that exhibits an optimally high crack resistance—in particular at a high glass transition temperature—with very good flow properties.

SUMMARY OF THE INVENTION

An object of the invention is to provide a casting resin with good flow properties and high crack resistance.

According to the invention, a casting compound suitable for casting an electronic module (in particular a large-volume coil such as a gradient coil) is provided to solve this problem, the casting compound being composed of a support material forming a matrix, one or more fillers made of inorganic microparticles and at least one filler made of polymer nanoparticles.

As is typical, the casting compound according to the invention is characterized by a support material forming a matrix as well as one or more fillers made of microparticles. According to the invention, in addition to the microparticle fillers, at least one filler made from a polymer nanoparticle is provided. Surprisingly, it has been shown that the addition of polymer nanoparticles produces a striking improvement of the parameters characterizing crack resistance, namely the critical stress intensity factor $K_{1C}$ and the critical fracture energy $G_{1C}$. By adding polymer nanoparticles, these parameters defining the crack resistance can even be markedly improved relative to casting compounds with inorganic nanoparticles.

Compared with casting compounds that only contain microparticle fillers, the casting compound according to the invention shows a very good flow behavior since this is not negatively affected by the added polymer nanoparticles (due to the particle size).

The polymer nanoparticles can be particles of polybutadiene, polystyrol or a polysiloxane or other elastomers, thermoplastics or hybrid materials or—if these are (as is preferred) core-shell nanoparticles, thus particles that consist of a core made from a first material and a shell made from a second material—can contain one of these materials. However, this list is not conclusive; naturally, other organic polymer nanoparticles can also be used. Polymer nanoparticles of one type or mixtures of different types can be used. The shape and size of the nanoparticles that are used can also ultimately be arbitrary, for example spherical, fibrous or like platelets given a size of preferably at least <1000 nm, in particular <100 nm.

Furthermore, it can be appropriate to additionally admix at least one filler made of inorganic nanoparticles. Additional parameters of the casting compound can be adjusted as needed by such inorganic nanoparticles. This means that, according to the invention, either only organic polymer nanoparticles or particle mixtures containing polymer and inorganic nanoparticles can be used.

The inorganic microparticles and the inorganic nanoparticles can be selected from $SiO_2$, $Al_2O_3$, AlN, $CaMg[CO_3]_2$ (dolomite), $TiO_2$, BN, $Fe_2O_3$, $Fe_3O_4$, ZnO, SiC, synthetic ceramics or zeolites, chalk, $Mg_3Si_4O_{10}(OH)_2$ (talcum), $CaSiO_3$ (wollastonite), pure carbon-based particles or mixtures of these. Here the shape of the microparticles or nanoparticles can also be arbitrary, for example spherical, fibrous or similar to platelets. The surface of the microparticles and nanoparticles can moreover be modified, for example surface-heated.

Although the possibility exists to add the polymer nanoparticles (possibly also the inorganic nanoparticles) in addition to the microparticle fillers that are unmodified (in terms of their content) compared with known casting compounds, an advantageous development provides that at least the polymer nanoparticles (possibly also the inorganic nanoparticles) substitute a portion of the microparticles. This means that the nanoparticles replace a certain percentage of the microparticles, which causes a reduction of the viscosity (assuming that the filler quantity remains the same compared with known casting compounds).

As already described, the polymer nanoparticles (possibly also the inorganic nanoparticles) are preferably core-shell nanoparticles, thus particles that consist of a core made of a first material and a shell made of a second material. These core-shell nanoparticles can be based on polybutadiene, polystyrol or a polysiloxane or other elastomers, thermoplastics or hybrid materials insofar as these are thereby organic polymer nanoparticles.

The average diameter or the average length (depending on which shape the nanoparticles have, be they polymers or inorganic) should be ≤1000 nm, in particular ≤100 nm.

The nanoparticles—be they polymers or inorganic nanoparticles—can each be of only one type or particle mixtures made up of multiple types. Different combinations are thereby conceivable. For example, two or more different polymer nanoparticle types can be mixed with one type of inorganic nanoparticles and vice versa; arbitrary combinations are conceivable.

The content of polymer nanoparticles should at maximum be 20% by weight, advantageously ≤10% by weight. Insofar as inorganic nanoparticles are also used, the total content of nanoparticles should likewise no longer be more than 20% by weight; the total content should likewise preferably be ≤10% by weight.

The casting compound with the polymer nanoparticle fillers according to the invention overall shows a markedly better behavior or, respectively, markedly better properties than known casting compounds. Polymer nanoparticles—in particular in spherical form—in principle benefit the compound. Filtration or sedimentation effects do not occur due to the particle size and particle shape. The particles additionally penetrate into narrow gaps or into regions already filled with fiber, meaning that upon casting a gradient coil an increase of the filler concentration occurs in these boundary regions within the coil winding due to polymer nanoparticles. The substitution of polymer nanoparticles (for example core-shell nanoparticles) for microscale (thus microparticle) filler significantly improves the mechanical fracture properties, wherein this is not limited with a deterioration of the glass transition temperature. The impact resistance is also simultaneously increased. This expresses itself in an increased shock tolerance of the nanomodified casting compound. In the very complex, multilayer design of a cast coil, this in particular has the effect of an improved property alteration, in particular in the area of the numerous boundary layers. A homogeneous distribution in the system as it is necessary for reproducibility of the property advantages and quality can be achieved with the casting compound according to the invention.

The invention also concerns an electronic module—in particular a gradient coil—cast with the casting compound according to the invention.

DESCRIPTION OF THE PREFERRED EMBODIMENTS

Figure 1:
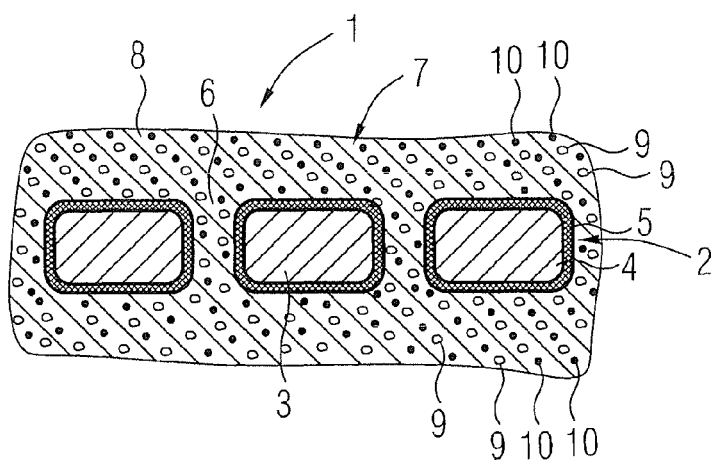
FIG. 1 is a cross-section of a portion of a coil according to the invention.

The superconducting coil 1 shown in FIG. 1 has a number of individual windings 2 of coil conductors 3 (shown larger than in reality for illustration purposes) that, in the shown exemplary embodiment, has an essentially rectangular cross section. The coil conductors 3 consist of a core 4 that contains the conductive material and an insulation 5 (for example made of a lacquer or thermoplastic coating or a plastic fiber weave) surrounding the core 4. The individual windings 2 are wound and packed with sufficient density; the spaces and interstices 6 shown here between the individual vertical and horizontal conductor layers are shown enlarged for clarity. The columns are actually most often markedly smaller. Such a coil also normally contains other layers, for example a cooling layer embodying coolant conduits and the like (not shown here but similarly cast).

After the winding of the individual conductors, it is now necessary to cast or impregnate these with a casting compound 7 so that the conductors 2 are completely embedded into this casting compound 7. The casting compound 7 includes a support material 8 forming a matrix, for example an epoxy resin based on bisphenol-A. Other matrix-forming reaction resins can also be used that have the desired properties and requirements in operation. In addition to the support material 8 forming the matrix, the casting compound 7 also include microparticles—thus fillers of microparticle size—embedded in the support material 8 and largely homogeneously distributed there. These microparticles 9 are, for example, selected from $SiO_2$, $Al_2O_3$, AlN, $CaMg[CO_3]_2$ (dolomite), $TiO_2$, BN, $Fe_2O_3$, $Fe_3O_4$, ZnO, SiC, synthetic ceramics or zeolites, chalk, $Mg_3Si_4O_{10}(OH)_2$ (talcum), $CaSiO_3$ (wollastonite), purely carbon-based particles or mixtures of these.

Furthermore, polymer nanoparticles 10, which are preferably core-shell nanoparticles (for example based on polybutadiene, polystyrol or a polysiloxane or other elastomers, thermoplastics or hybrid materials or the like), are provided as additional filler. The polymer nanoparticles 10 are likewise mixed into the fluid casting compound; like the microparticle fillers, they definitively distribute essentially homogeneously in all gaps or interstices 6 of the individual conductor windings or, respectively, other layers. The average particle size of the introduced polymer nanoparticles should be between 0.5 nm-1000 nm, preferably ≤100 nm. The particle shape (like that of the microparticle fillers) can ultimately be arbitrary, for example round, spherical, oblong etc. for example. The nanoparticles 10 can be of one particle type but can also be mixtures of different particle types. The maximum concentration of the admixed nanoparticles should not exceed 20% by weight of the resin portion forming the matrix; a concentration of less than 10% by weight is preferable.

It is also possible to admix inorganic nanoparticles (not shown in detail here) in addition to the polymer nanoparticles 10. These nanoparticles can be of the same materials as the microparticles.

It has been shown that the mechanical properties—in particular the crack resistance, the impact resistance and the bonding to wetted boundary surfaces—can already be significantly improved by a slight addition of the polymer nanoparticles to the epoxy resin system of the casting compound 6. The flow capability of the casting compound is not negatively affected by the low active content of nanoparticles and as a result of the homogeneous distribution and small size, meaning that the distribution of the resin is adjusted as before in the same manner and consequently the impregnation behavior of the casting compound does not negatively change. As a result of their minimal size, the nanoparticles are also particularly advantageously not filtered out in regions of narrow gaps; rather, it is possible that they can even penetrate into extremely narrow gaps together with the support material and can largely homogeneously distribute there.

Various characteristic property values of a typical casting compound containing 66% by weight of a microparticle filler an a casting compound according to the invention in which 3.4% by weight of polymer nanoparticles and 62.6% by weight of microparticle filler are contained (3.4% of microparticle filler are thus replaced with polymer nanoparticles) are compared with one another in the following table. The support material respectively contains a modified epoxy resin based on bisphenol-A as a resin component. A modified anhydride curer based on methyl hexahydrophthalic acid anhydride is respectively contained as a cure component; a tertiary amine is used as an accelerator. Quartz powder with an average particle size of 20 μm and a silanized surface was used as microparticle filler in both examined casting compounds. Spherical core-shell nanoparticles based on polybutadiene with a particle size ≤100 nm was used as a polymer nanoparticle.

The characteristic molding material properties—thus the measurement values of the cured casting compound that were determined from corresponding samples—are respectively shown in the table with regard to the respective two examined casting compounds; the respective measurement methods according to ISO or DIN or ASTM are also specified. The sample bodies were respectively cured in a two-stage curing method. In the first stage the curing took place at 80° C. for 8 hours; in the second, subsequent stage the curing took place at 140° C. for 10 hours. The respective measured characteristic solid values can be learned from the left column; as stated, the second column indicates the sample geometry. The determined characteristic solid values for the respective sample consisting of support material forming the matrix and 66% microparticle filler are indicated in the third column while the respective characteristic solid values for the casting compound according to the invention, with 62.6% microparticle filler and 3.4% polymer nanoparticle filler, are shown in the right column.

TABLE 1

| Characteristic Molding Material Property | Sample Geometry | 66% (Microp.) | 3.4% Polymer Nanop. (62.6% Microp.) |
|---|---|---|---|
| Coefficient of linear thermal expansion α [ppm] (ISO 11359-2) | 3 × 3 × 4 mm | 34 | 35 |
| Glass transition $T_G$ [° C.] (ISO 11359-2) | 3 × 3 × 4 mm | 103 | 109 |
| Flexural modulus of elasticity E [MPa] (DIN EN ISO 178) 5.0 mm/min | 10 × 15 × 125 mm | 8747 ± 511 | 7050 ± 276 |
| Flexural strength [MPa] (DIN EN ISO 178) 5.0 mm/min | 10 × 15 × 125 mm | 121 ± 9.2 | 121 ± 1.3 |
| Impact toughness [kJ/m$^2$] (DIN EN ISO 179) | 10 × 15 × 125 mm | 12 ± 1.2 | 15 ± 3.2 |
| Mechanical dissipation factor tan $\delta_{mech}$ [—] (DIN 65583) | 10 × 15 × 125 mm | $2.51 \cdot 10^{-2}$ | $2.41 \cdot 10^{-2}$ |
| Storage modulus E' [MPa] (DIN 65583) | 10 × 15 × 125 mm | 8639 | 6930 |
| Loss modulus E" [MPa] (DIN 65583) | 10 × 15 × 125 mm | 217 | 167 |
| Modulus of elasticity in tension [MPa] (DIN EN ISO 527-2) | 10 × 15 × 125 mm | 12543 ± 564 | 9149 ± 586 |
| Tensile strength [MPa] (DIN EN ISO 527-2) | 10 × 15 × 125 mm | 76.5 ± 4.9 | 72.1 ± 0.7 |
| Critical stress intensity factor $K_{1C}$ [MPa $\sqrt{m}$] (according to ASTM E 399) Double Torsion | 80 × 40 × 4 mm central V-notch 60° | 1.90 ± 0.04 | 2.75 ± 0.05 |
| Critical fracture energy $G_{1C}$ [J/m$^2$] (According to ASTM E 399) Double Torsion | 80 × 40 × 4 mm central V-notch 60° | 337 ± 19 | 987 ± 36 |

An improvement is clearly shown at nearly all determined characteristic solid values with the casting compound according to the invention. In comparison to the casting compound to which only microparticles are added, the glass transition temperature and the impact toughness increase. The significant improvement of the critical stress intensity factor $K_{1C}$ and the critical fracture energy $G_{1C}$ (which are significant criteria of the crack resistance) is in particular noticeable.

This means that the casting compound to which polymer nanoparticles have been added is markedly more resistant to cracking than a comparable casting compound without these polymer nanoparticles.

These two central values—namely the critical stress intensity factor $K_{1C}$ and the critical fracture energy $G_{1C}$ for the casting compound with 66% by weight added microparticle filler; for the casting compound with 62.6% microparticle filler and 3.4% inorganic nanoparticle filler; and for a third casting compound with 62.6% microparticle filler and 3.4% polymer nanoparticle filler in the form of spherical $SiO_2$ nanoparticles with a particle size from 20-30 nm (D50)—are indicated in Table 2 below. This means that this table enables a good comparison between two casting compounds that in one case possess the polymer nanoparticles added according to the invention and in the other case possess no polymer nanoparticles but rather only inorganic nanoparticles in the same mass concentration.

TABLE 2

| Characteristic Molding Material Property | Sample Geometry | 66% (Microp.) | 3.4% Inorganic Nanop. (62.6% Microp.) | 3.4% Polymer Nanop. (62.6% Microp.) |
|---|---|---|---|---|
| Critical stress intensity factor $K_{1C}$ [MPa $\sqrt{m}$] (according to ASTM E 399) Double Torsion | 80 × 40 × 4 mm central V-notch 60° | 1.90 ± 0.04 | 2.14 ± 0.06 | 2.75 ± 0.05 |
| Critical fracture energy $G_{1C}$ [J/m$^2$] (According to ASTM E 399) Double Torsion | 80 × 40 × 4 mm central V-notch 60° | 337 ± 19 | 433 ± 25 | 987 ± 36 |

The respective measured characteristic molding material property—namely the critical stress intensity factor and the critical fracture energy—is again indicated in the left column; the respective sample geometry is indicated in the second column; characteristic solid values for the casting compound with only microparticle filler of 66% by weight remain in the third column; the characteristic molding material properties given the addition of 3.4% inorganic nanoparticles are indicated in the fourth column; and the characteristic molding material properties given the addition of 3.4% polymer nanoparticles are indicated in the fifth column.

As can be seen from Table 2, a striking improvement can be achieved by exchanging the inorganic nanoparticles for polymer nanoparticles. The critical stress intensity factor $K_{1C}$ of 2.14±0.06 given a casting compound with 62.6% microparticles and 3.4% inorganic nanoparticles increases to 2.75±0.05 given the casting compound according to the invention with 62.6% microparticles and 3.4% polymer nanoparticles, an increase of approximately 30%.

There is similar behavior with the markedly improved fracture energy: this increases from 433±25 J/m$^2$ to 987±36 J/m$^2$ in the casting compound according to the invention. This means that a striking crack resistance improvement can be achieved by exchanging the inorganic nanoparticles for polymer nanoparticles.

Figure 2:
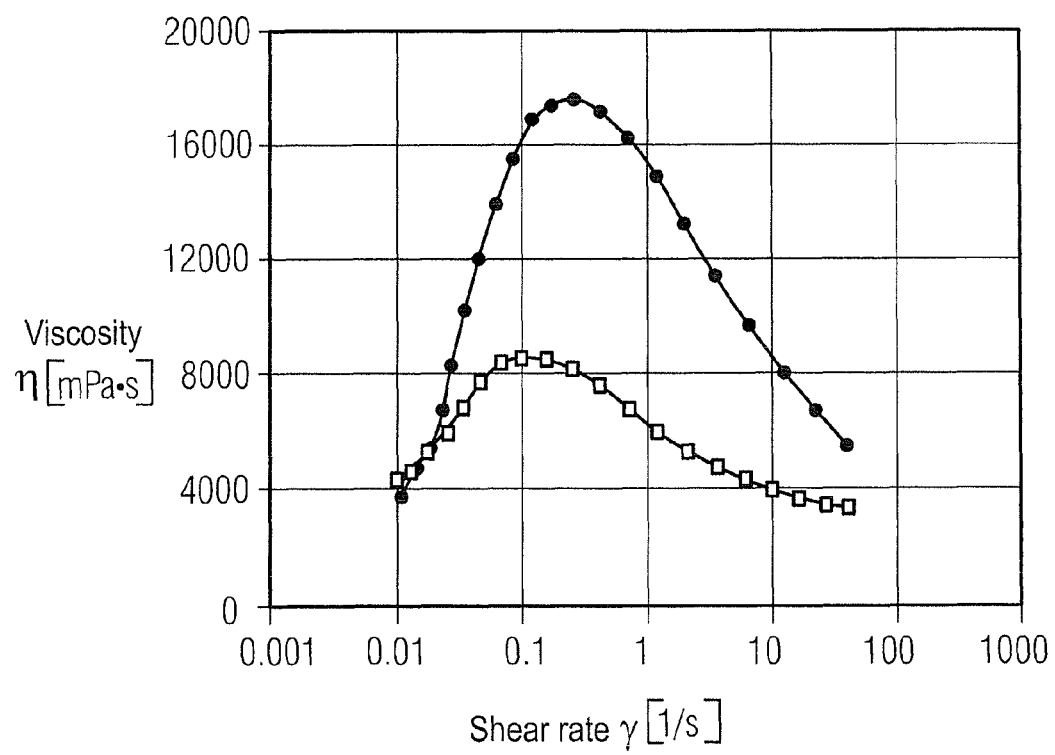
FIG. 2 is a graph showing the viscosity curve of a casting compound according to the invention in comparison with a casting compound containing only microparticle fillers.

An examination of the flow behavior has ultimately yielded that the substituted nanoparticle addition produces a very good flow behavior. The course of the flow curve (circle symbols) of a previously used casting compound containing a matrix-forming support material made of modified epoxy resin based on bisphenol-A, a curer made of modified anhydride based on methyl hexahydrophthalic acid anhydride and an accelerator made from tertiary amine (in addition to 66% microparticles) is compared in FIG. 2 with a casting compound according to the invention that contains the same matrix-forming support materials, 62.4% microparticles and 3.6% polymer nanoparticles made from polybutadiene in core-shell form (box symbols). As FIG. 2 clearly shows, a marked decrease of the viscosity can be achieved. The shear rate is shown along the abscissa in $s^{-1}$; the viscosity is shown along the ordinate in mPa·s. The preparation temperature was 50° C.; the shear rate range is 0.07-500 $s^{-1}$. The viscosity in the shear rate range of 0.03-20 $s^{-1}$ is markedly reduced (by more than half in broad ranges) by the addition of the polymer nanoparticles. The course of the curve shows no thixotropic effects over the entire shear rate range.

Due to the markedly better flow behavior, the proportion of inorganic microfiller could also be increased again in order to counter the reduction of the E-modulus that is seen in Table 1.

Although modifications and changes may be suggested by those skilled in the art, it is the intention of the inventor to embody within the patent warranted hereon all changes and modifications as reasonably and properly come within the scope of his contribution to the art.

We claim as our invention:

1. A casting compound that is used in casting an electronic module, of a magnetic resonance gradient coil, the casting compound comprising:
    a resin support material that forms a casting compound support matrix,
    said matrix including therein:
        at least one filler comprised of inorganic microparticles, and
        at least one filler comprised of polymer nanoparticles;
        whereby the presence of said matrix of inorganic microparticles and polymer nanoparticles, causes said casting compound to flow into and impregnate, without voids and bubbles, existing interstices in a conductor pattern of a magnetic resonance gradient coil and
        wherein the presence of said matrix of inorganic microparticles and polymer nanoparticles, also makes said casting compound, when cured crack-resistant with an improved critical stress intensity factor $K_{1c}$ and an improved critical fracture energy $G_{1c}$.

2. A Casting compound according to claim 1, wherein the polymer nanoparticles are polymer nanoparticles that are formed of a polymer selected from the group consisting of polybutadiene, polystyrol, a polysiloxane, other elastomers, thermoplastics or hybrid materials.

3. A Casting compound according to claim 1, wherein the polymer nanoparticles are polymer nanoparticles that contain a polymer selected from the group consisting of polybutadiene, polystyrol, a polysiloxane, other elastomers, thermoplastics or hybrid materials.

4. A Casting compound according to claim 1, wherein said casting compound further comprises at least one additional filler made of inorganic nanoparticles is additionally contained.

5. A Casting compound according to claim 1, characterized wherein the inorganic microparticles are formed of at least one material selected from the group consisting of $SiO_2$, $Al_2O_3$, AlN, $CaMg[CO_3]_2$, $TiO_2$, BN, $Fe_2O_3$, $Fe_3O_4$, ZnO, SiC, at synthetic ceramics, zeolites, chalk, $Mg_3Si_4O_{10}(OH)_2$, $CaSiO_3$, and pure carbon-based.

6. A Casting compound according to claim 1, wherein at least some of the inorganic microparticles are inorganic nanoparticles.

7. A Casting compound according to claim 1, wherein the polymer nanoparticles are each homogeneously made of one material.

8. A Casting compound according to claim 1, wherein the polymer nanoparticles are each core-shell nanoparticles comprising a core surrounded by a shell.

9. A Casting compound according to claim 1, wherein the inorganic microparticles are each homogeneously made of one material.

10. A Casting compound according to claim 1, wherein the inorganic microparticles are each core-shell nanoparticles comprising a core surrounded by a shell.

11. A casting compound according to claim 1, wherein at least one of said polymer nanoparticles and said inorganic microparticles has a dimension, selected from the group consisting of an average diameter and an average length, that is 1000 nm.

12. A casting compound according to claim 1, wherein at least one of said polymer nanoparticles and said inorganic microparticles has a dimension, selected from the group consisting of an average diameter and an average length, that is 100 nm.

13. A casting compound as claimed in claim 1, wherein said polymer nanoparticles are all formed of only one type of polymer nanoparticles.

14. A casting compound as claimed in claim 1, wherein said polymer nanoparticles comprise different types of polymer nanoparticles.

15. A casting compound as claimed in claim 1, wherein said inorganic microparticles are all formed of only one type of inorganic microparticles.

16. A casting compound as claimed in claim 1, wherein said inorganic microparticles comprise different types of inorganic microparticles.

17. A casting compound as claimed in claim 1, wherein said polymer nanoparticles comprise a maximum of 20% by weight, of a total of said support material, said polymer nanoparticles and said inorganic microparticles.

18. A casting compound as claimed in claim 1, wherein said polymer nanoparticles comprise 10% by weight, of a total of said support material, said polymer nanoparticles and said inorganic microparticles.

19. A magnetic resonance gradient coil comprising:
an electrical conductor comprising:
a conductor pattern configured to generate a magnetic gradient field designed in order to facilitate acquisition of magnetic resonance data from a subject,
said conductor pattern exhibiting pattern interstices;
a casting compound in which said electrical conductor is cast in order to form said conductor pattern exhibiting pattern interstices; and
said casting compound comprising:
a support material that forms a casting compound support matrix, said matrix including therein
at least one filler comprised of inorganic microparticles, and
at least one filler comprised of polymer nanoparticles;
whereby the presence of said matrix of inorganic microparticles and polymer nanoparticles, causes said casting compound to flow into and impregnate, without voids and bubbles, said conductor pattern interstices of said electrical conductor and
wherein the presence of said matrix of inorganic microparticles and polymer nanoparticles, also makes said casting compound, when cured, crack-resistant with an improved critical stress intensity factor $K_{1c}$ and an improved critical fracture energy $G_{1c}$.

* * * * *